(12) United States Patent  
Peake

(10) Patent No.: US 7,332,771 B2  
(45) Date of Patent: Feb. 19, 2008

(54) TRENCH-GATE SEMICONDUCTOR DEVICES

(75) Inventor: Steven T. Peake, Warrington (GB)

(73) Assignee: NXP, B.V. (NL)

( * ) Notice: Subject to any disclaimer, the term of this patent is extended or adjusted under 35 U.S.C. 154(b) by 0 days.

(21) Appl. No.: 10/511,212

(22) PCT Filed: Apr. 10, 2003

(86) PCT No.: PCT/IB03/01465

§ 371 (c)(1),
(2), (4) Date: Oct. 13, 2004

(87) PCT Pub. No.: WO03/088364

PCT Pub. Date: Oct. 23, 2003

(65) Prior Publication Data

US 2005/0173757 A1    Aug. 11, 2005

(30) Foreign Application Priority Data

Apr. 18, 2002  (GB)  ................................ 0208833.4

(51) Int. Cl.
*H01L 29/76*  (2006.01)
(52) U.S. Cl. ...................... 257/329; 257/328; 257/330; 257/E27.091
(58) Field of Classification Search ........ 257/328–330, 257/E27.091
See application file for complete search history.

(56) References Cited

U.S. PATENT DOCUMENTS

| | | | | |
|---|---|---|---|---|
| 5,072,266 A | * | 12/1991 | Bulucea et al. | 257/330 |
| 5,468,982 A | * | 11/1995 | Hshieh et al. | 257/331 |
| 5,629,543 A | * | 5/1997 | Hshieh et al. | 257/330 |
| 5,665,996 A | * | 9/1997 | Williams et al. | 257/401 |
| 5,688,725 A | * | 11/1997 | Darwish et al. | 438/270 |
| 5,689,128 A | * | 11/1997 | Hshieh et al. | 257/331 |
| 5,866,931 A | | 2/1999 | Bulucea | |
| 5,895,952 A | * | 4/1999 | Darwish et al. | 257/330 |
| 5,910,669 A | * | 6/1999 | Chang et al. | 257/339 |
| 6,031,265 A | * | 2/2000 | Hshieh | 257/334 |
| 6,084,264 A | * | 7/2000 | Darwish | 257/329 |
| 6,188,104 B1 | * | 2/2001 | Choi et al. | 257/330 |
| 6,316,806 B1 | * | 11/2001 | Mo | 257/330 |
| 6,351,009 B1 | * | 2/2002 | Kocon et al. | 257/328 |
| 6,413,822 B2 | * | 7/2002 | Williams et al. | 438/270 |
| 6,518,624 B2 | * | 2/2003 | Kim et al. | 257/330 |
| 6,552,389 B2 | * | 4/2003 | Yasuhara et al. | 257/335 |
| 6,791,143 B2 | * | 9/2004 | Baliga | 257/328 |
| 6,822,288 B2 | * | 11/2004 | Hshieh et al. | 257/330 |

* cited by examiner

*Primary Examiner*—Eugene Lee
(74) *Attorney, Agent, or Firm*—Peter Zawilski

(57) ABSTRACT

A trench-gate vertical power transistor in which the trench-gates (11) are parallel stripes which extend across the active area (100). Source regions (13) and ruggedness regions (15) extend to a source contact surface as alternating stripe areas having a width perpendicular to and fully between each two adjacent parallel stripe trench-gates (11). The ruggedness regions (15) are more heavily doped than the source regions and this enables an increased length of the source regions with a consequent reduction in specific resistance of the transistor. For example, the mesa width (13,15) and the trench-gate (11) width may both be about 0.4 µm, the ruggedness region (15) length may be about 1 µm and the source region (13) length may be about 20 µm. The doping concentration of the p type ruggedness regions (15) may be approximately 10 times greater than the doping concentration of the n type regions (13), for example about $10_{21}$ cm$_{-3}$ and about $10_{20}$ cm$_{-3}$ respectively.

15 Claims, 5 Drawing Sheets

TRENCH-GATE SEMICONDUCTOR DEVICES

Figure 1:
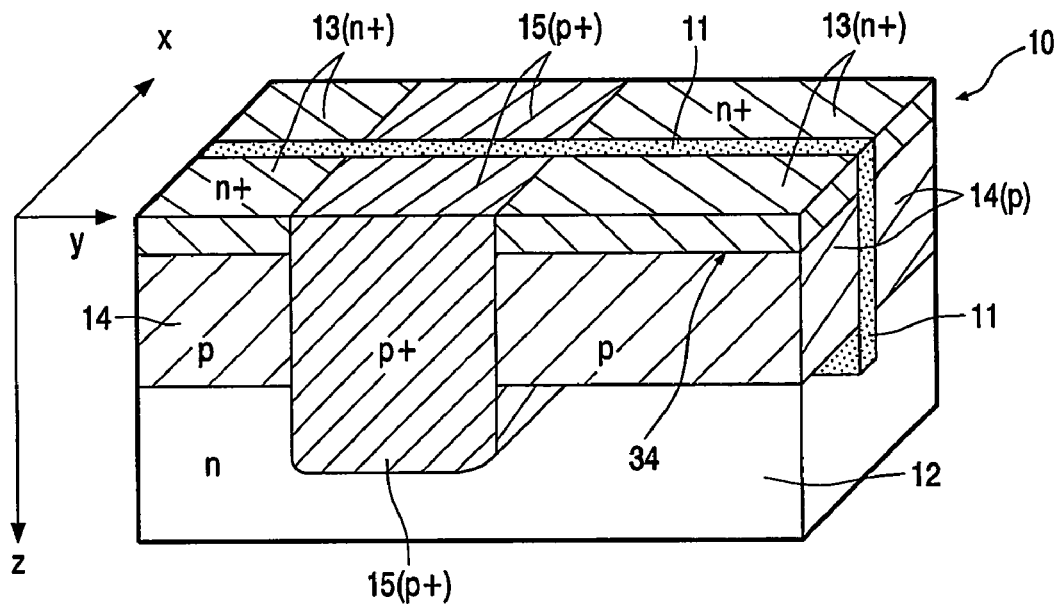

This invention relates to vertical power transistor trench-gate semiconductor devices.

Such semiconductor devices are known comprising a semiconductor body having an active area with a plurality of electrically parallel transistor cells. Trench-gates in the active area each comprise a trench extending into the semiconductor body with gate material in the trench. The transistor cells have source and drain regions of a first conductivity type which are separated by a channel-accommodating region of a second, opposite, conductivity type adjacent a trench-gate.

Two types of trench-gate geometries have been proposed for these known devices. In a closed-cell geometry there is a two-dimensionally repetitive pattern in which annular trench-gates surround each transistor cell in the active area. In an open-cell geometry there is a one-dimensionally repetitive pattern in which the trench-gates are parallel stripes which each extend across an active area of the device.

Factors which are known and taken into account in considering the two trench-gate geometries include the following.

The specific resistance of the device, that is the drain-source resistance in the on-state should be as small as possible. A greater number of transistor cells in a given active area can result in a greater total perimeter of channel-accommodating region in the active area and hence a smaller specific resistance of the device. The open-cell geometry inherently can provide a greater perimeter of channel-accommodating region and hence a smaller device specific resistance. This is because of the open-cell geometry itself and also because, compared with a closed-cell geometry, less critical processing techniques are required to provide accurately aligned small lateral dimensions and regions and hence a greater number of transistor cells in a given area.

The source, channel-accommodating region, and drain regions constitute parasitic bipolar transistors. This parasitic bipolar action is suppressed in the first instance by providing that the source electrode of the device electrically connects the source regions to the channel-accommodating regions at the surface of the device. However, under sufficiently high voltage and current conditions one or more of these parasitic bipolar transistors may incidentally turn on with a lateral current under the source region high enough to permanently damage the device. It is known to provide device ruggedness, that is further protection against parasitic bipolar turn on, by providing ruggedness regions, that is localised regions which are of the same conductivity type but more heavily doped than the channel accommodating regions and which extend into the drain region so as to provide an avalanche diode vertical current path from the drain region through the ruggedness region to the source electrode.

For a closed-cell geometry having ruggedness regions, each ruggedness region must be at the centre of a cell and spaced from the surrounding trench-gate. The space required for the ruggedness regions and the techniques required for producing them tend to increase the size of the closed-cells and hence increase the specific resistance of a device having a given active area.

Proposals which have been made for open-cell stripe geometries having ruggedness regions include the following two types of configurations.

In a first proposed open-cell configuration type source regions and ruggedness regions are provided which extend to a source contact surface of the semiconductor body as alternating stripe areas having a width perpendicular to and fully between each two adjacent parallel stripe trench-gates. This configuration is, in particular, suited to less critical processing techniques so that it can be provided with a small cell width between adjacent stripe trench-gates and hence high cell density and small device specific resistance. However, the presence of the ruggedness region stripes at the sides of the stripe trench-gates reduces the channel-accommodating region perimeter and this is more the case the more length of the cell is occupied by the ruggedness regions. If the ruggedness regions are spaced too far apart, that is if the length of source regions along the stripe trench-gates is too high, then the ruggedness regions are less effective in suppressing parasitic bipolar action. In this first type of open-cell configuration the damaging lateral current flow under the source regions due to incidental parasitic bipolar turn on is in a direction lengthwise with respect to the stripe trench-gates. Another factor is that it is customary in trench-gate semiconductor devices to have heavily doped source regions in order to reduce the contact resistance to the source electrode which contributes to the specific resistance of the device. However, the larger the doping of the source regions the larger is the gain of the parasitic bipolar transistors, and this effect is more of a problem for this first type of open-cell configuration where the source regions have a large area compared with their area in closed cell configurations. This first type of open-cell configuration is disclosed in U.S. Pat. No. 5,072,266 (Bulucea and Rossen) as a prior art proposal. While the problems with this configuration are not described in exactly the same terms as we have discussed above, it is said in this US patent that this open-cell geometry is inherently more susceptible to bipolar breakdown, the problems of a greater or lesser spacing of the ruggedness regions in this open-cell geometry are discussed, and this configuration is rejected in favour of a closed-cell configuration having particular characteristics in accordance with the invention of this U.S. patent. In the examples of the invention described in this US patent the source regions are more heavily doped than the ruggedness regions.

In a second proposed open-cell configuration type, a ruggedness region is centrally located and spaced from each two adjacent parallel stripe trench-gates and this ruggedness region extends continuously lengthwise with respect to the trench-gates. Source regions extend continuously lengthwise with respect to the stripe trench-gates and contact to the source regions across the whole width between adjacent stripe trench-gates is provided by a comparatively shallow source surface contact region between source regions. Surface contact to the ruggedness region is made at intervals lengthwise of the stripe trench-gates through openings in the shallow source surface contact region. In this second open-cell configuration type, channel-accommodating perimeter along the length of the stripe trench-gates is not taken away by the centrally placed lengthwise ruggedness region. Also, in this second open-cell configuration type, the lateral current flow under the source regions which needs to be suppressed by the ruggedness region is widthwise with respect to the stripe trench-gates, and this lateral current flow will tend to be less of a problem than for the above-discussed first open-cell configuration type. However, as for closed-cell configurations, more critical processing techniques are required to accommodate and accurately align the central lengthwise ruggedness region and the contact openings to this ruggedness region. This needs a greater width between adjacent stripe trench-gates than for the first open-cell configuration type, resulting in reduced channel-accommodating perimeter and hence increased specific resistance of a device having a given active area. U.S. Pat. No. 5,866,931 (Bulucea and Rossen) considers these first and second open-cell configuration types and rejects the first type in favour of the second type and a modification of the second type having elongated hexagonal closed cells. In the examples of the invention described in this US patent the source regions are more heavily doped than the ruggedness regions. The teaching of this US patent is concerned with the reliability of contact to the source and channel-accommodating regions where there is a large number of transistor cells in a given active area of a device.

EP-A-1,033,759 (Intersil) discloses trench-gate devices in which the invention concerns the insulation covering the gate material in the trenches being coplanar with the upper surface of the device. Examples are disclosed of application both to a closed-cell configuration device and to an open-cell configuration device. In both cases a channel-accommodating p type body region has a heavily doped p+ type body region at the surface next to an n+ source region, but the p+ region does not extend into the drain region. In the open-cell configuration example the n+ regions and the p+ regions are alternating stripe areas having a width perpendicular to and fully between each two adjacent parallel stripe trench-gates but, since the p+ region does not extend into the drain region, the disclosed open-cell configuration in this EP document is not in accordance with the first type of open-cell configuration which we have discussed above. In relation to the disclosed closed-cell configuration, the source region formation precedes the p+ region formation but it is stated that this sequence is not critical. In relation to the disclosed open-cell configuration, overall formation of p+ regions precedes masked formation of the n+ source regions.

The present invention provides a device with an open-cell configuration of the first type discussed above while alleviating the problems which have been mentioned in relation to that type of configuration.

The invention is based on a finding by the present inventor that in this type of configuration a significantly improved suppression of parasitic bipolar transistor action is achieved if the ruggedness regions are more heavily doped than the source regions, thus enabling a greater length of the source regions with a corresponding reduction in specific resistance of the device.

According to one embodiment of the present invention there is provided a vertical power transistor trench-gate semiconductor device comprising a semiconductor body having an active area with a plurality of electrically parallel transistor cells, wherein trench-gates in the active area each comprise a trench extending into the semiconductor body with gate material in the trench, wherein the transistor cells have source and drain regions of a first conductivity type which are separated by a channel-accommodating region of a second, opposite, conductivity type adjacent a trench-gate, wherein ruggedness regions are provided which are localised regions of the second conductivity type but which are more heavily doped than the channel-accommodating regions and which extend into the drain region, wherein the trench-gates are parallel stripes which each extend across the active area, wherein the source regions and the ruggedness regions extend to a source contact surface of the semiconductor body as alternating stripe areas having a width perpendicular to and fully between each two adjacent parallel stripe trench-gates, and wherein the device is characterised in accordance with the invention by the ruggedness regions being more heavily doped than the source regions.

According to another embodiment of the present invention, there is provided a trench-gate vertical power transistor, wherein the trench-gates are parallel stripes which extend across the active area, source regions and ruggedness regions extend to a source contact surface as alternating stripe areas having a width perpendicular to and fully between each two adjacent parallel stripe trench-gates, and the ruggedness regions are more heavily doped than the source regions so as to enable an increased length of the source regions with a consequent reduction in specific resistance of the transistor.

In devices having a closed-cell geometry with ruggedness regions as discussed above, and in devices having the second open-cell configuration type as discussed above, it has been customary to consider that the doping concentration of the ruggedness regions is sufficient for the purpose if it is greater than the doping concentration of the adjacent channel-accommodating region and that it is undesirable to have ruggedness region doping concentration much higher than this because of the consequent decrease in the breakdown voltage of the device. Also, it has been customary in devices of these two types to have heavily doped source regions in order to reduce the contact resistance to the source electrode. This has resulted in the source regions being customarily more heavily doped than the ruggedness regions. Typically the doping concentration of an n-type source is $10^{21}$ cm$^{-3}$ with a corresponding doping concentration of the ruggedness region being $10^{19}$ cm$^{-3}$.

The present inventor has found that for devices having the first type of open-cell configuration as discussed above if, contrary to customary practice, the ruggedness regions are more heavily doped than the source regions it is possible to retain satisfactory suppression of parasitic bipolar action while having source regions of sufficient length to provide a worthwhile reduction in specific resistance of the device. The following discussion is provided with a view to explaining this inventive result.

In this first type of open-cell configuration source regions and ruggedness regions are provided which extend to a source contact surface of the semiconductor body as alternating stripe areas having a width perpendicular to and fully between each two adjacent parallel stripe trench-gates. The ruggedness region function is to provide an avalanche diode vertical current path; however a small percentage of this current will instead flow laterally in the channel-accommodating region under the adjacent source region, that is in a direction lengthwise with respect to the stripe trench-gates in this configuration, and there will be a potential drop along this lateral current flow. Depending on the amount of this lateral current and the emitter efficiency of the source region, at a certain distance from the ruggedness region the emitter-base junction (between the source region and the channel-accommodating region) would become forward biased and the parasitic bipolar junction transistor would turn on. This emitter-base forward bias will be at a central region of the source region between two ruggedness regions lengthwise of the stripe trench-gates, and so to retain effective suppression of bipolar action the length of the source region must be less than twice this distance from the ruggedness regions at which the emitter-base junction would become forward biased.

If the ruggedness regions are more heavily doped than the source regions, then the effect of the high ruggedness region doping combined with the low source region doping is as follows. High ruggedness region doping provides a correspondingly lower resistance vertical current path and a correspondingly smaller percentage of this current will flow laterally under the source region with a correspondingly smaller potential drop along this lateral current flow, thus contributing to a greater distance from the ruggedness region at which the emitter-base junction would become forward biased and so permitting a greater source region length with bipolar action suppression. A higher ruggedness region doping does lead to a lower breakdown voltage of the device, but we consider that this can be acceptable if it is taken into account in the specification of the device. Low source region doping provides a correspondingly reduced emitter efficiency of the parasitic bipolar transistor and a reduced gain of this bipolar transistor so that less current tends to flow across the emitter-base junction, and this also contributes to a greater distance from the ruggedness region at which the emitter-base junction would become forward biased. A lower source region doping does lead to a higher contact resistance to the source electrode, but we consider that this effect on the specific resistance of the device is more than compensated by the effect on the specific resistance of the device of having a greater channel-accommodating perimeter due to longer source regions. In any case, the longer source regions provide larger source region areas which reduces this contact resistance. A metal-semiconductor compound layer can be provided to reduce the source contact resistance, but this may not be necessary.

The present invention is advantageously applied to a device in which the cell pitch, that is the width of the source and ruggedness region stripes (mesa width) plus the width of an adjacent trench-gate stripe, is less than 2 µm. This small cell pitch provides a high cell density and hence small device specific resistance. With presently available processing techniques it would be difficult to provide devices with this small cell pitch and having ruggedness regions in either a closed-cell geometry or in an open-cell configuration of the second type discussed above. In accordance with the present invention, an open-cell configuration of the first type can have this small cell pitch with the length of the source region stripes being in the range 10 µm to 50 µm while having satisfactory suppression of parasitic bipolar action. We have found that a 10 µm source region length is greater than could be used with satisfactory suppression of parasitic bipolar action if the source regions were more heavily doped than the ruggedness regions as has previously been customary. We have found that there is an insignificant further reduction in specific resistance of the device for a source region length greater than 50 µm.

The cell pitch may be in the range 0.5 µm to 1.5 µm, and the mesa width is preferably approximately equal to the trench-gate stripe width. In an example in accordance with the invention, the mesa width and the trench-gate stripe width are each 0.4 µm.

Although the source region length may be up to 50 µm, a preferred range for this length in accordance with the invention is 10 µm to 30 µm. The specific resistance of the device decreases by only a small amount for a source region length above 30 µm while the risk of parasitic bipolar action continues to increase as the source region length increases. In a preferred example with an advantageously low device specific resistance the length of the source region stripes is approximately 20 µm.

The ruggedness region stripes are effective even if their length is small, and so it is preferred to have them as short as possible in order to minimise the loss of channel-accommodating region perimeter. With processing techniques capable of providing a cell pitch of less than 2 µm, for example in the range of 0.5 µm to 1.5 µm as mentioned above, the length of the ruggedness region stripes is preferably not greater than about 1 µm. Taking into account the length of the ruggedness region stripes, in accordance with the invention a preferred ratio of the length of the source region stripes to the length of the ruggedness region strips is in the range 10 to 30. In an example in accordance with the invention, this ratio is about 20.

In a power transistor device in accordance with the invention, the semiconductor body is preferably silicon with the ruggedness regions having p-type conductivity and the source regions having n-type conductivity. In this case, a preferred range for the ruggedness region doping concentration is $10^{19}$ cm$^{-3}$ to $10^{22}$ cm$^{-3}$ and a preferred range for the source region doping concentration is $10^{18}$ cm$^{-3}$ to $10^{21}$ cm$^{-3}$. The ruggedness region doping concentration of $10^{19}$ cm$^{-3}$ is a preferred minimum for these regions to provide their function as avalanche diode vertical current paths while allowing the source region doping concentration to be lower, in accordance with the invention, without the contact resistance of these source regions being unacceptably high. For higher ruggedness region doping concentrations, the vertical current paths which these regions provide have lower resistance and they are more effective by allowing a smaller proportion of the breakdown current to travel a smaller distance laterally under the source regions, thus allowing the source regions to have a higher doping and thereby reduced contact resistance. The ruggedness region doping concentration of $10^{22}$ cm$^{-3}$ is a preferred maximum for these regions in order for the amount by which they reduce the drain-source breakdown voltage of the device to be acceptably small. The source region doping concentration of $10^{18}$ cm$^{-3}$ is a preferred minimum for these regions which may avoid the need to provide a silicide layer to reduce the contact resistance to the device source electrode. The source region doping concentration of $10^{21}$ cm$^{-3}$ is a preferred maximum so as to avoid damage at the surface of the cells.

In accordance with the invention the doping concentration of the ruggedness regions is preferably approximately 10 times greater than the doping concentration of the source regions. For example, the doping concentration of the ruggedness regions may be about $10^{21}$ cm$^{-3}$ with the doping concentration of the source regions being about $10^{20}$ cm$^{-3}$.

In accordance with the invention the ruggedness regions preferably extend further into the drain region than the trench-gates.

In accordance with the invention the power transistor devices are preferably low voltage devices with the drain-source breakdown voltage of the device below 200 volts, and more particularly with the drain-source breakdown voltage in the range up to about 50 volts.

Figure 2:
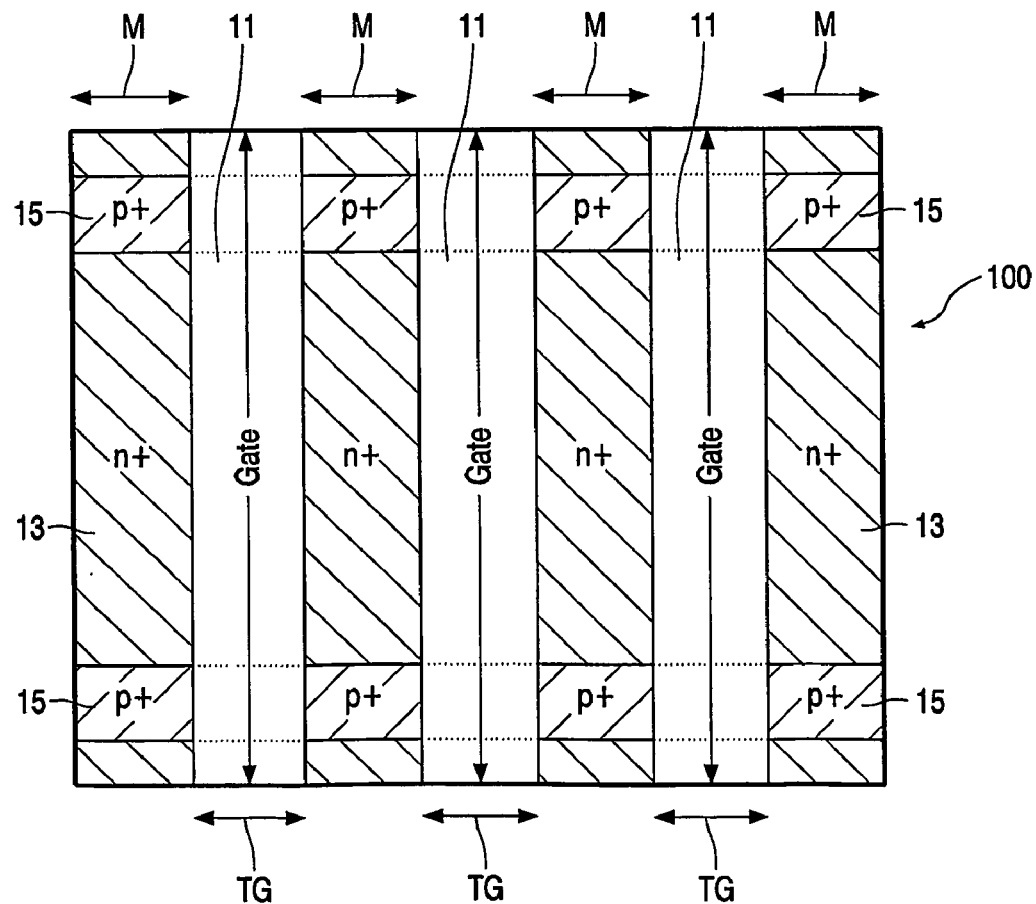
Figure 3:
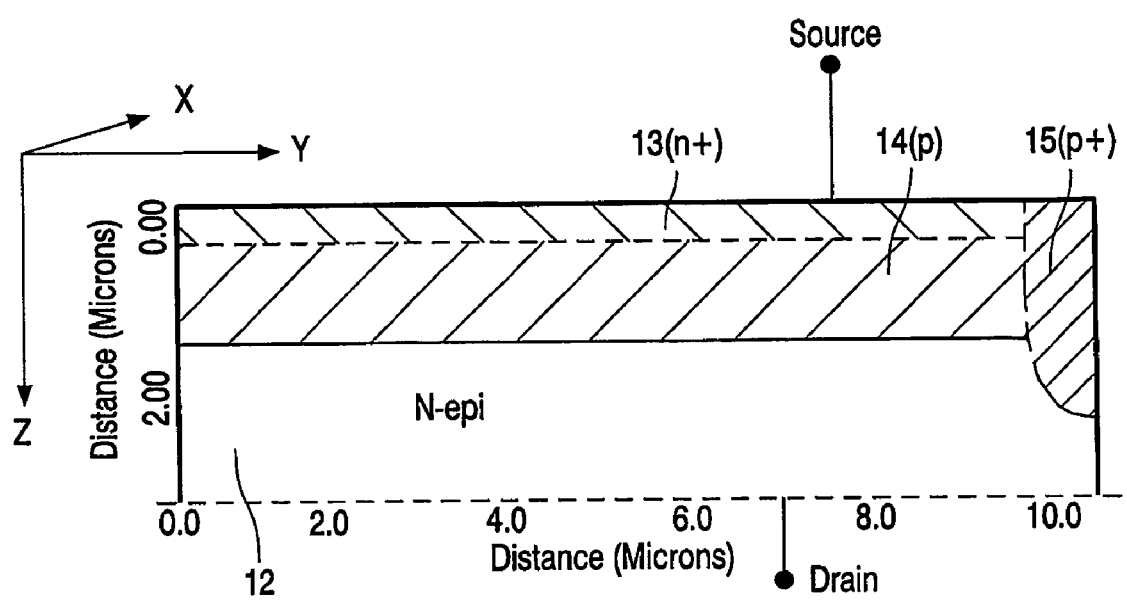

These and other features in accordance with the present invention are illustrated in embodiments now to be described with reference to the accompanying diagrammatic drawings, in which:

FIGS. 1 and 2 respectively show a part perspective section view and a plan view of the active area of a device in accordance with the invention, FIG. 3 shows a section view along the length of part of a transistor cell of the device of FIGS. 1 and 2, and FIGS. 4A to 4C, 5A to 5C, and 6A to 6C show computer simulation results for the absence or presence of bipolar junction transistor breakdown in the cell shown in FIG. 3 for different relative dopant concentrations of ruggedness region and source region.

Referring now to FIGS. 1 and 2, a vertical power transistor (typically a MOSFET) trench-gate semiconductor device comprises a silicon semiconductor body 10 having an active area 100 with a plurality of electrically parallel transistor cells. Trench-gates 11 in the active area 100 each comprise a trench extending into the semiconductor body 10 with gate material in the trench. An n-type epitaxial layer 12 forms drain regions for the transistor cells. The transistor cells have n+ type source regions 13; and the source and drain regions are separated by a p type region 14 which provides a channel-accommodating body region adjacent a trench-gate 11. Ruggedness regions 15 are also provided as localised p+ type regions, that is they are more heavily doped than the p type body regions 14, and which extend into the drain region 12 and moreover further into the drain region 12 than the trench-gates. The trench-gates 11 are parallel stripes which each extend across the active area 100, the source regions 13 and the ruggedness regions 15 extend to a source contact surface, the upper surface as shown in. FIGS. 1 and 2, of the semiconductor body 10 as alternating stripe areas having a width perpendicular to and fully between each two adjacent parallel stripe trench-gates 11. The ruggedness regions 15 are more heavily doped than the source regions 13.

In a typical example of the device shown in FIGS. 1 and 2, the cell pitch, that is the width of the source and ruggedness region stripes 13, 15 (mesa width M) plus the width TG of an adjacent trench-gate stripe 11 is 0.8 µm with the mesa width M being approximately equal to the trench-gate stripe width TG, the length of the ruggedness region 15 stripes is not greater than about 1 µm and the length of the source region stripes is approximately 20 µm. In this typical example, the doping concentration of the ruggedness regions is about $10^{21} \times cm^{-3}$ and the doping concentration of the source regions is about $10^{20} \times cm^{-3}$.

A suitable process for making the device shown in FIGS. 1 and 2 may include the following stages. Starting with the n type epitaxial layer 12 extending to the upper surface of the semiconductor body 10, the p+ type ruggedness regions 15 are provided as parallel stripes across the active area 100 by masking, implantation and diffusion. Trenches for the trench-gates 11 are then formed by masking parallel stripes orthogonal to the ruggedness regions 15 and etching. The trenches are then lined with deposited gate insulating oxide, and then filled with doped polysilicon gate material. The p type channel-accommodating regions 14 are then formed by implantation and annealing. Insulating oxide is then provided on top of the gate material of the trench-gates 11. The n+ type source regions 13 are then formed by implantation and diffusion. Metallisation then provides a source electrode contacting the source regions 13 and the ruggedness regions 15 at the upper surface of the semiconductor body.

Referring now to FIG. 3, there is shown a section view along the length of part of a transistor cell of the device of FIGS. 1 and 2. The x, y and z axes on FIG. 3 correspond to those shown on FIG. 1. Simulation investigations were carried out on the region shown in FIG. 3, that is along a trench-gate side wall along the y axis.

The method to determine if the bipolar junction transistor is active (that is the base/emitter junction 34 becomes forward biased) was to implement the continuation method in Medici. With this continuation method the drain voltage is steadily increased (beyond the ionisation integral of 1) until such time that the drain current as a function of drain voltage characteristic 'snaps back'. When this snap back occurs the base/emitter junction 34 has become forward biased and the parasitic bipolar junction transistor is operating. The breakdown voltage was increased until a current density of 0.1 mA/µm was reached.

The y axis origin (0.0 µm) shown in FIG. 3 is at a mid-point halfway along the length of a source region 13 as shown in FIG. 2, and the y axis shown in FIG. 3 extends to the mid-point of a ruggedness region 15. Thus in accordance with FIG. 3, the length of the source region 13 is approximately 20 µm and the length of the ruggedness region is approximately 1 µm. The n type drain region 12 thickness was set to 3 µm at a doping concentration of $3 \times 10^{16}$ cm$^{-3}$ (25V silicon). The n+ type source region 13 doping concentration was set at $5 \times 10^{18}$ cm$^{-3}$. The p type channel-accommodating body region 14 doping concentration was set to $1.5 \times 10^{17}$ cm$^{-3}$. The doping concentration of the p+ type ruggedness region was set at different levels to assess any change in cell performance.

Figure 4A:
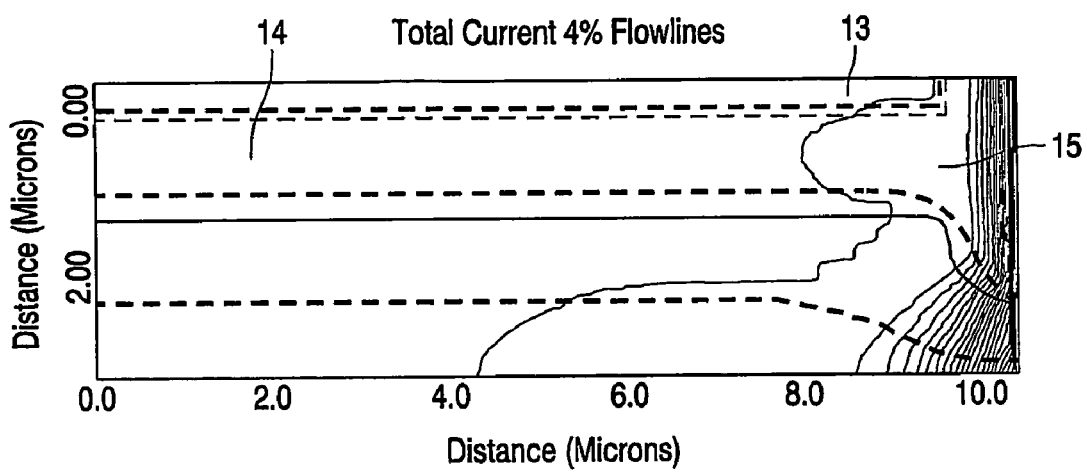
Figure 4B:
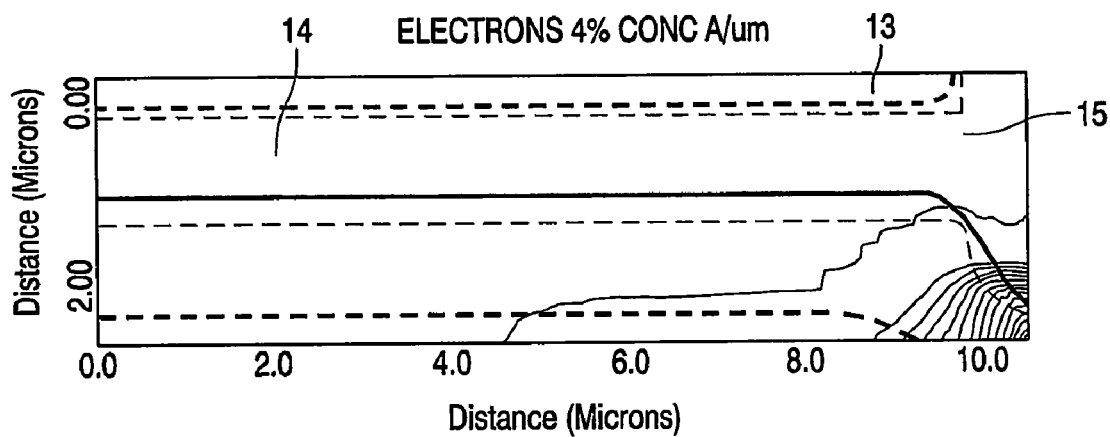
Figure 4C:
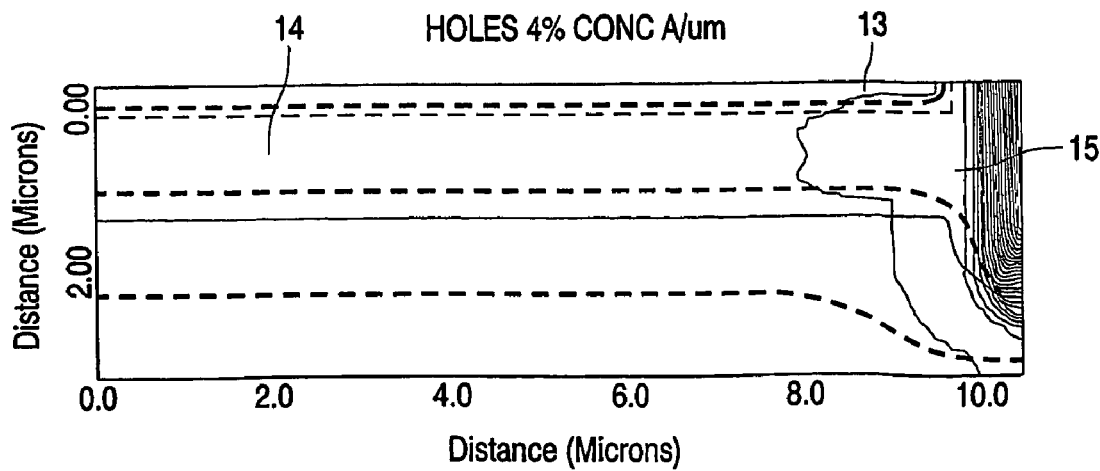

The simulation results for the p+ type ruggedness region 15 doping concentration at $5 \times 10^{19}$ cm$^{-3}$, that is 10 times greater than the doping concentration of the source region 13 are shown in FIGS. 4A to 4C, wherein FIG. 4A shows total current, FIG. 4B shows electron current and FIG. 4C shows hole current. In these Figures, the solid lines represent current flow and the dashed lines represent depletion boundaries. Breakdown at this p+ concentration was 27V, which was approximately 3V less than for this MOSFET in the absence of the ruggedness regions 15. No bipolar junction transistor 'snap back' occurred at 0.1 mA/µm. The FIGS. 4A to 4C results show that with the ruggedness regions 15 being 10 times more heavily doped than the source regions 13, the length of the source regions 13 could be 20 µm with satisfactory parasitic bipolar action suppression. Further simulations have shown that this bipolar action suppression is maintained for a source region length of 30 µm, and we consider that this would still be so for a source region length up to 50 µm.

Figure 5A:
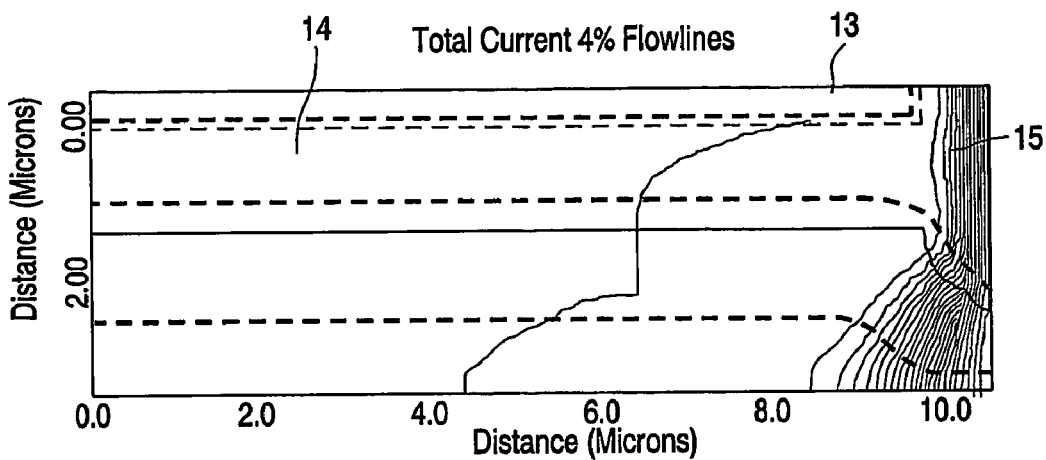
Figure 5B:
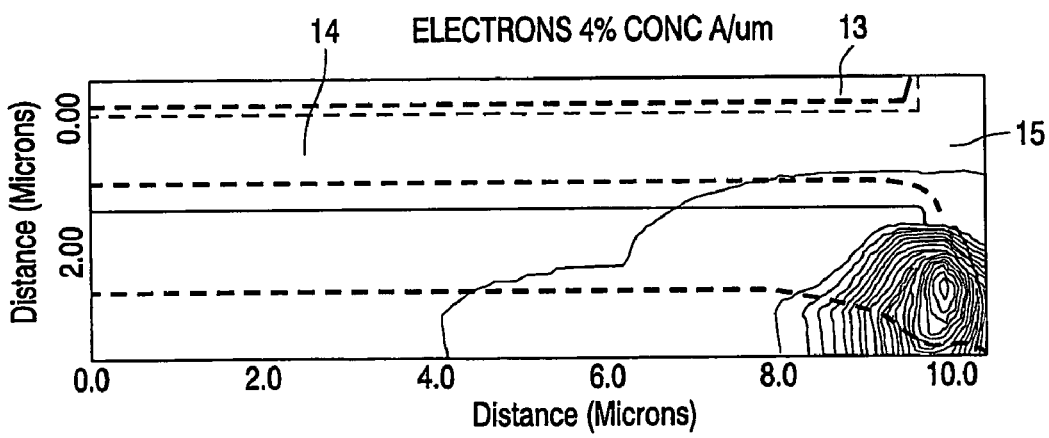
Figure 5C:
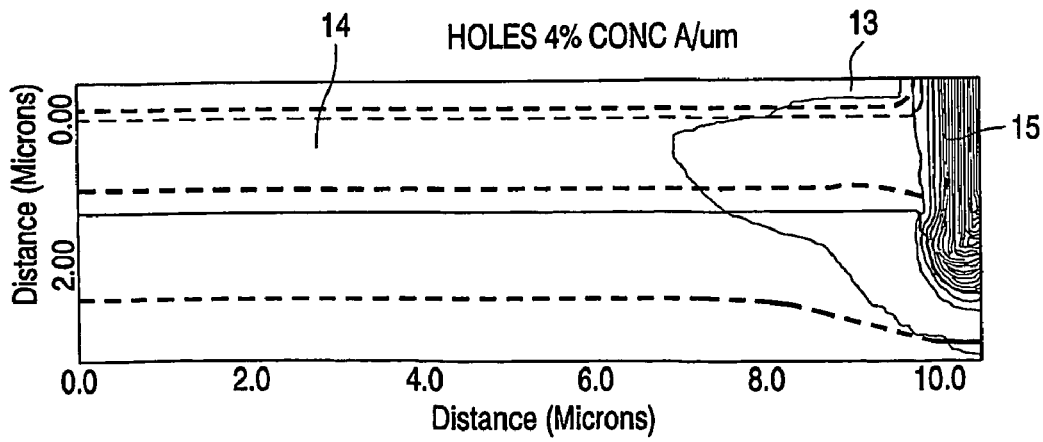

The simulation results for the p+ type ruggedness region 15 doping concentration at $1 \times 10^{19}$ cm$^{-3}$, that is 5 times greater than the doping concentration of the source region 13 are shown in FIGS. 5A to 5C, wherein FIG. 5A shows total current, FIG. 5B shows electron current and FIG. 5C shows hole current. In these Figures, the solid lines represent current flow and the dashed lines represent depletion boundaries. Breakdown at this p+ concentration was 29V, which was approximately 1V less than for this MOSFET in the absence of the ruggedness regions 15. No bipolar junction transistor 'snap back' occurred at 0.1 mA/µm; however there is now a lateral voltage drop beginning to traverse the source region 13 due to holes. The FIGS. 5A to 5C results show that with the ruggedness regions 15 being 5 times more heavily doped than the source regions 13, the length of the source regions 13 again could be 20 µm with satisfactory parasitic bipolar action suppression.

Figure 6A:
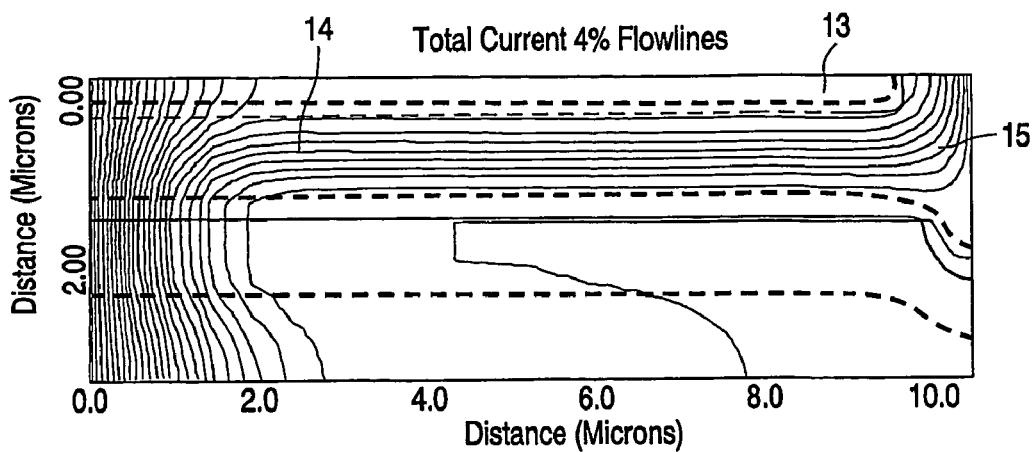
Figure 6B:
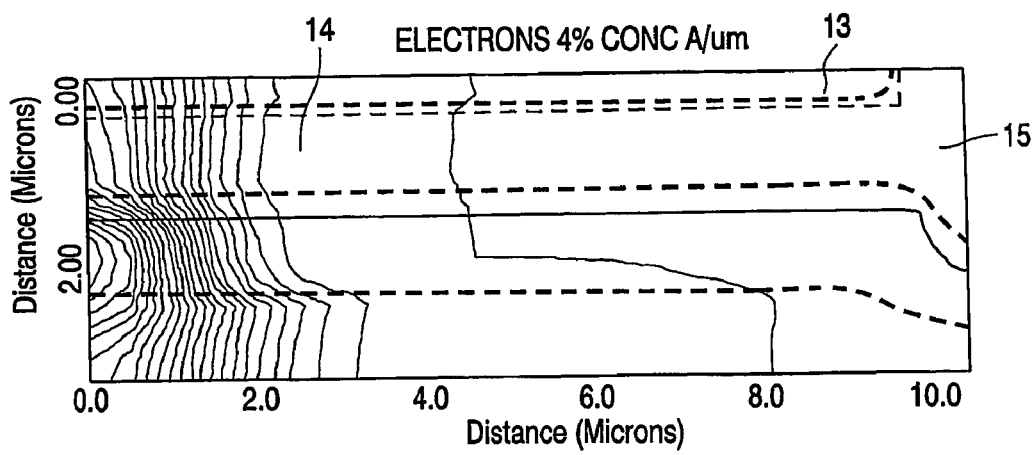
Figure 6C:
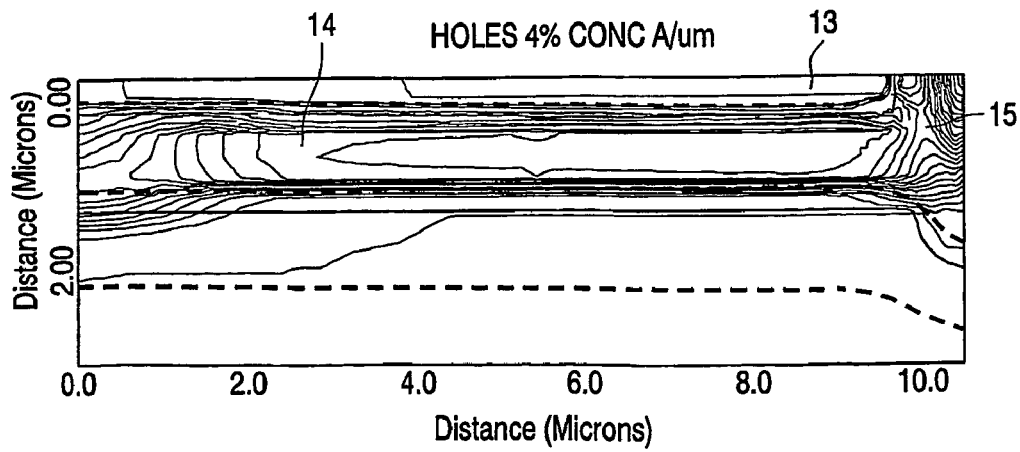

The simulation results for the p+ type ruggedness region 15 doping concentration at $1 \times 10^{18}$ cm$^{-3}$, that is 5 times lower than the doping concentration of the source region 13 are shown in FIGS. 6A to 6C, wherein FIG. 6A shows total current, FIG. 6B shows electron current and FIG. 6C shows hole current. In these Figures, the solid lines represent current flow and the dashed lines represent depletion boundaries. Breakdown at this p+ concentration was 30V, which was the normal entitlement for this MOSFET in the absence of the ruggedness regions 15. 'Snap back' to 17V occurred at 0.02 mA/µm. The parasitic bipolar junction transistor is now in operation due to the lateral voltage drop across it. This lateral voltage was provided by the holes. Electrons can be seen to flow at approximately y=3 µm. The FIGS. 6A to 6C results show that with the ruggedness regions 15 being less heavily doped than the source regions 13, the length of the source regions would have to be less than 10 µm for satisfactory suppression of bipolar action.

From reading the present disclosure, other variations and modifications will be apparent to persons skilled in the art. Such variations and modifications may involve equivalent and other features which are already known in the art (for example in the cited background references) and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention.

The Applicants hereby give notice that new Claims may be formulated to any such features and/or combinations of such features during the prosecution of the present Application or of any further Application derived therefrom.

The invention claimed is:

1. A vertical power transistor trench-gate semiconductor device comprising a semiconductor body having an active area with a plurality of electrically parallel transistor cells, wherein trench-gates in the active area each comprise a trench extending into the semiconductor body with gate material in the trench, wherein the transistor cells have source and drain regions or a first conductivity type which are separated by a channel-accommodating region of a second, opposite, conductivity type adjacent a trench-gate, wherein ruggedness regions are provided which are localised regions of the second conductivity type but which are more heavily doped than the channel-accommodating regions and which extend into the drain region, wherein the trench-gates are parallel stripes which each extend across the active area, wherein the source regions and the ruggedness regions extend to a source contact surface of the semiconductor body as alternating stripe areas having a width perpendicular to and fully between each of two adjacent parallel stripe trench-gates, and wherein the device is characterized by the ruggedness regions being more heavily doped than the source regions.

2. A power transistor device as claimed in claim 1, wherein the cell pitch, that is the width of the source and ruggedness region stripes (mesa width) plus the width of an adjacent trench-gate stripe, is less than 2 µm, and wherein the length of the source region stripes is in the range of 10 µm to 50 µm.

3. A power transistor device as claimed in claim 2, wherein the cell pitch is in the range of 0.5 µm to 1.5 µm.

4. A power transistor device as claimed in claim 2, wherein the mesa width is approximately equal to the trench-gate stripe width.

5. A power transistor device as claimed in claim 2, wherein the length of the source region stripes is in the range 10 µm to 30 µm.

6. A power transistor device as claimed in claim 5, wherein the length of the source region stripes is approximately 20 µm.

7. A power transistor device as claimed in claim 2, wherein the length of the ruggedness region stripes is not greater than about 1 µm.

8. A power transistor device as claimed in claim 2, wherein the ratio of the length of the source region stripes to the length of the ruggedness region stripes is in the range 10 to 30.

9. A power transistor device as claimed in claim 8, wherein the ratio of the source region stripe length to ruggedness region stripe length is about 20.

10. A power transistor device as claimed in claim 1, wherein the semiconductor body is silicon, wherein the ruggedness regions have p-type conductivity with a doping concentration in the range of $10^{19}$ cm$^{-3}$ to $10^{22}$ cm$^{-3}$, and wherein the source regions have n-type conductivity with a doping concentration in the range of $10^{18}$ cm$^{-3}$ to $10^{21}$ cm$^{-3}$.

11. A power transistor device as claimed in claim 1, wherein the doping concentration of the ruggedness regions is approximately 10 times greater than the doping concentration of the source regions.

12. A power transistor device as claimed in claim 11, wherein the doping concentration of the ruggedness regions is about $10^{21}$ cm$^{-3}$ and the doping concentration of the source regions is about $10^{20}$ cm$^{-3}$.

13. A power transistor device as claimed in claim 1, wherein the ruggedness regions extend further into the drain region than the trench-gates.

14. A power transistor device as claimed in claim 1, wherein the drain-source breakdown voltage of the device is in the range up to about 50 volts.

15. A vertical power transistor trench-gate semiconductor device comprising a semiconductor body having an active area with a plurality of electrically parallel transistor cells, wherein trench-gates in the active area each comprise a trench extending into the semiconductor body with gate material in the trench, wherein the transistor cells have source and drain regions of a first conductivity type which are separated by a channel-accommodating region of a second, opposite, conductivity type adjacent a trench-gate, wherein ruggedness regions are provided which are localised regions of the second conductivity type but which arc more heavily doped than the channel-accommodating regions and which extend into the drain region, wherein the trench-gates are parallel stripes which each extend across the active area, wherein the source regions and the ruggedness regions extend to a source contact surface of the semiconductor body as alternating stripe areas having a width perpendicular to and fully between each of two adjacent parallel stripe trench-gates, and wherein the device is characterized by the ruggedness regions being more heavily doped than the source regions, and wherein the length of the ruggedness regions is less than the length of the source regions, and wherein a distance between two immediately adjacent channel-accommodating regions equals the width of the source regions.

* * * * *